United States Patent
Snelgrove et al.

(10) Patent No.: US 7,352,237 B2
(45) Date of Patent: Apr. 1, 2008

(54) RADIO FREQUENCY POWER AMPLIFIER AND CORRESPONDING METHOD

(75) Inventors: William Martin Snelgrove, Toronto (CA); Kelly Mekechuk, Austin, TX (US); David Kelly, Austin, TX (US); Richard Wilson, Austin, TX (US)

(73) Assignee: Pulsewave RF, Inc., Austin, TX (US)

( * ) Notice: Subject to any disclaimer, the term of this patent is extended or adjusted under 35 U.S.C. 154(b) by 595 days.

(21) Appl. No.: 11/089,834

(22) Filed: Mar. 25, 2005

(65) Prior Publication Data

US 2006/0217089 A1   Sep. 28, 2006

(51) Int. Cl.
*H03F 3/38* (2006.01)

(52) U.S. Cl. .......................... 330/10; 330/306
(58) Field of Classification Search .................. 330/10, 330/306, 277, 282, 291
See application file for complete search history.

(56) References Cited

U.S. PATENT DOCUMENTS

| | | | |
|---|---|---|---|
| 3,919,656 A | | 11/1975 | Sokal et al. |
| 4,015,213 A | * | 3/1977 | Hamada ...................... 330/10 |
| 4,691,172 A | * | 9/1987 | Fukahori et al. ............ 330/129 |
| 4,843,339 A | | 6/1989 | Burt et al. |
| 5,352,986 A | | 10/1994 | Modgil et al. |
| 5,777,512 A | | 7/1998 | Tripathi et al. |
| 5,974,089 A | | 10/1999 | Tripathi et al. |
| 6,191,653 B1 | | 2/2001 | Camp, Jr. et al. |
| 6,373,334 B1 | | 4/2002 | Melanson |
| 6,518,838 B1 | | 2/2003 | Risbo |
| 6,563,378 B1 | * | 5/2003 | Kirn ........................... 330/10 |
| 6,577,189 B2 | | 6/2003 | Jayaraman et al. |
| 6,630,899 B2 | | 10/2003 | Jayaraman |
| 2002/0180547 A1 | | 12/2002 | Staazewski et al. |
| 2004/0203544 A1 | | 10/2004 | Levesque et al. |
| 2005/0064828 A1 | | 3/2005 | Kurakami et al. |
| 2007/0249304 A1 | * | 10/2007 | Snelgrove et al. ....... 455/127.2 |

OTHER PUBLICATIONS

J. Keyzer, et al., "Digital Generation of RF Signals for Wireless Communications With Band-Pass Delta-Sigma Modulation", 2001 IEEE MTT-S Digest pp. 2127-2130.

R. Schreier and M. Snelgrove, "Bandpass Sigma-Delta Modulation", Electronic Letters, No. 9, 1989, vol. 25. No. 23, pp. 1560-1561.

H. Balan, M. Declercq, "12v Class-D Amplifier in 5V CMOS Technology", 1995 IEEE Cusom Integrated Circuits Conference, pp. 559-562.

(Continued)

*Primary Examiner*—Henry Choe
(74) *Attorney, Agent, or Firm*—Charles W. Bethards

(57) ABSTRACT

A radio frequency power amplifier and corresponding methods are arranged and configured to drive or provide a radio frequency signal to a resonant load. The amplifier includes a radio frequency switching stage with an output that is coupled to a resonant circuit and configured to provide an output signal with amplitude modulation corresponding to amplitude modulation of an input signal when powered from a fixed voltage power supply and a feedback control system coupled to the input signal and the output signal. The feedback control system includes a sequencer configured to provide a sequencer output that is used to drive the radio frequency switching stage, where the sequencer output has an OFF state that begins at a variable time corresponding to the input and output signal.

33 Claims, 8 Drawing Sheets

OTHER PUBLICATIONS

Enrico Dallago and Gabriele Sassone, "Single-Cycle Quasi-Resonant Converters as Sigma-Delta Audio Power Stages", 1996 IEEE, pp. 645-650.

M.A.E. Andersen, "A New Application for Zero-Current-Switched Full-Wave Resonant Converters", 1993 The European Power Electronics Association, pp. 83-86.

Ion E. Opris and Gregory T. A. Kovacs, "A Video bandwidth Analog Median Circuit", IEEE 1995 Custom Integrated Circuits Conference pp. 555-558.

Glen Luckjiff, et al., "Interpolative Sigma Delta Modulators for High Frequency Power Electronic Applications", 1995 IEEE, pp. 444-449.

Mihai Albulet, RF Power Amplifiers, 2001, Noble Publishing, pp. 269-270.

Hai Tao & John M. Khoury, "A 400-MS/s Frequency Translating Bandpass Sigma-Delta Modulator", Dec. 1999, pp. 1741-1752.

Steven R. Norsworthy, Richard Schreier, Gagor C. Temes, Delta-Sigma Data Converters 1996, IEEE pp. 1-43.

Martin Snelgrove, "Intermediate-Function Synthesis", Dec. 1981, Department of Electrical Engineering University of Toronto. pp. 185-226.

\* cited by examiner

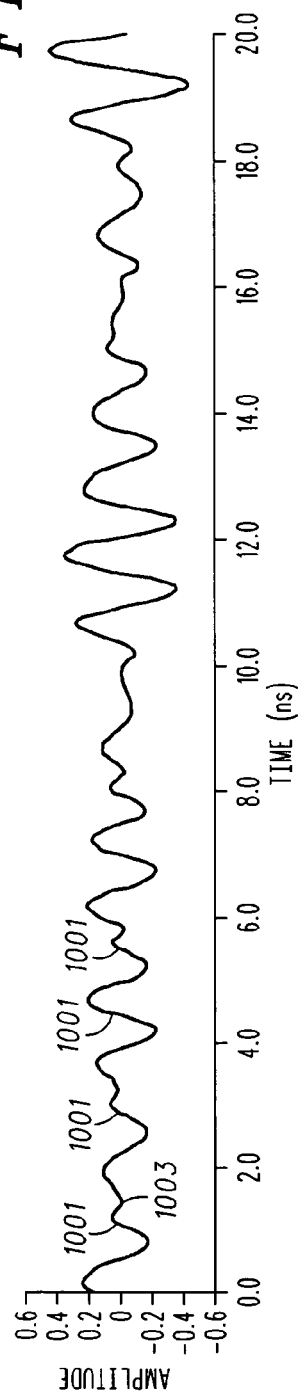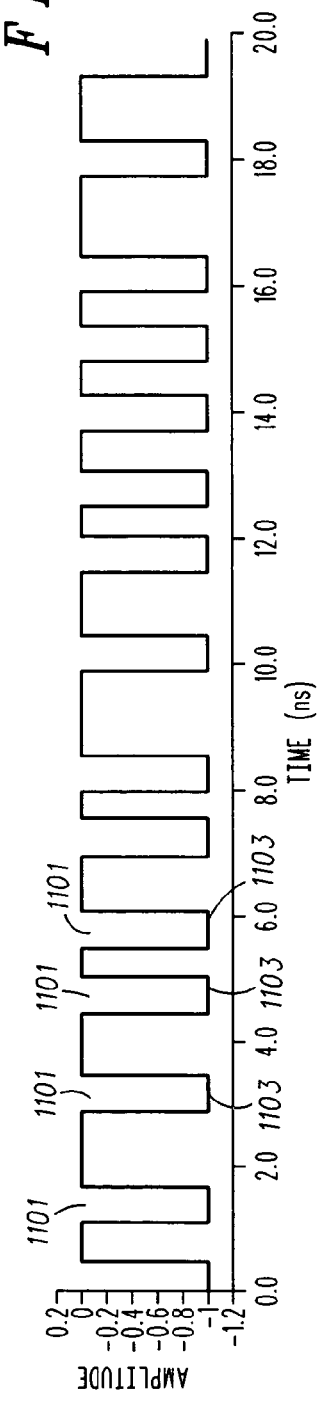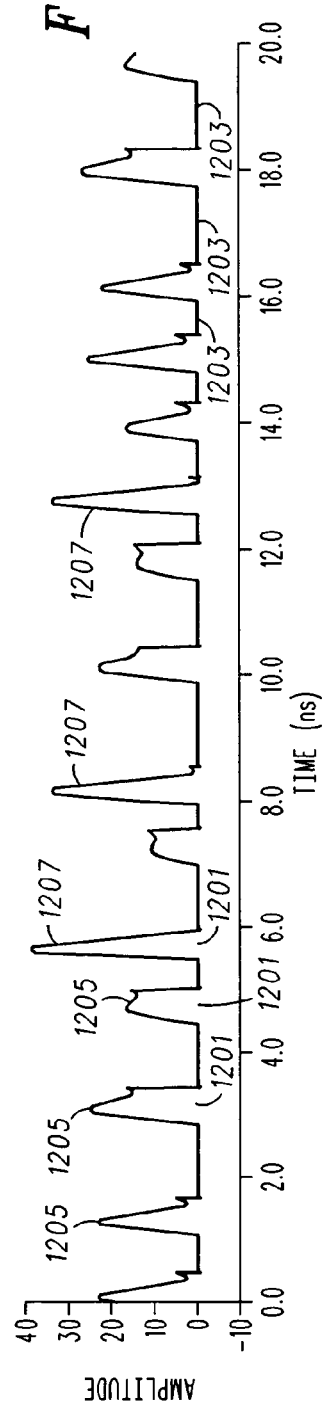

RADIO FREQUENCY POWER AMPLIFIER AND CORRESPONDING METHOD

FIELD OF THE INVENTION

This invention relates in general to communication equipment, and more specifically to radio frequency power amplifiers.

BACKGROUND OF THE INVENTION

Radio-frequency power amplifiers are essential components of transmitters found in radio communication systems, and are deployed in various applications, such as mobile telephony, broadcast, wireless data networking, radiolocation and other fields. Generally, they function to make copies of their inputs, which are signals generated by other components of communication equipment, such as base transmitters, mobile devices, or the like, where the copies or output signals are powerful enough to propagate for appropriate distances. Two often conflicting requirements that constrain radio frequency power amplifiers are linearity and efficiency.

The linearity requirement or constraint on a radio frequency power amplifier is that it reproduces the form of its input signal faithfully. Small distortions in the form of the output signal relative to the input can cause the radio frequency power amplifier to interfere with other radio services, in violation of regulatory requirements, or make it difficult or impossible to receive/demodulate the signal accurately. These distortions may be caused, for example, by the fact that the characteristics of the components of which a radio frequency power amplifier is composed (e.g. transistors) are non-ideal, e.g., vary with the electrical currents that they carry, which necessarily include the signal being reproduced. A conventional method ("class A operation") of getting good linearity in this situation is to add a large "bias" current to signal currents so that current variations due to the signal are small in comparison.

The efficiency requirement or constraint means that the amplifier should not consume excessive power relative to its desired output power: thus, for example, an amplifier required to produce 10 Watts of output power may typically consume 100 Watts. This is often caused by the use of large bias currents, as described above, to improve linearity. The power (90 Watts in the example) "wasted" in this way causes many problems. For example, the power dissipated is manifested as heat, which has to be removed—often with large heat sinks and fans—before it causes temperature rises that damage the amplifier or other circuits. When equipment is battery-operated (e.g. in cell phones or in fixed installations (base transmitters) that are running on backup batteries during a power failure), battery size and hence weight and cost increases directly with power requirements.

Relatively efficient power amplifier circuits are known, and for radio frequency power amplifiers one of the more efficient is known as type or class "E". These amplifiers attempt to operate their transistors as pure switches, which in principle dissipate (and hence waste) no power. Their operation depends on synchronization between closing the "switch" device and the "ringing" of a resonant load circuit, such that the switch is only driven closed at times when the voltage across it is almost zero. However, class E amplifiers pose problems. For example, since there output power is effectively set by a power supply voltage, they are difficult to amplitude-modulate and attempts to do so have resulted in both poor efficiency and poor linearity. The inability to modulate amplitude severely limits applicability of the class E amplifiers in most modern systems employing complex forms of modulation with varying amplitude or amplitude inverting signals.

Another switching power amplifier is known as class "D". This amplifier architecture has been used for audio-frequency applications. Class D amplifiers in theory have low power dissipation (e.g. a switch does not dissipate power). In practice, since Class D amplifier are continually discharging capacitance (e.g., when turned on) and this can amount to significant power dissipation at radio frequencies.

Sigma-delta technology is a known technique that allows feedback to be used to linearize, for example, class "D" switching amplifiers for audio-frequency use, but ordinarily this technology requires that switching events be synchronous to a fixed clock frequency. Typically, a sigma delta loop samples the output of a loop filter at a fixed rate that is independent of any input signal. This causes problems for class E radio frequency power amplifiers since their inputs need to be synchronized with a high frequency signal. Note that sigma-delta and delta-sigma are expressions that may be used interchangeably in this document.

BRIEF DESCRIPTION OF THE DRAWINGS

The accompanying figures where like reference numerals refer to identical or functionally similar elements throughout the separate views and which together with the detailed description below are incorporated in and form part of the specification, serve to further illustrate various embodiments and to explain various principles and advantages in accordance with the present invention.

FIG. 5 through FIG. 14 show various representative waveforms resulting from an experimental simulation of a radio frequency power amplifier in accordance with the embodiment depicted in FIG. 2;

DETAILED DESCRIPTION

Figure 1:
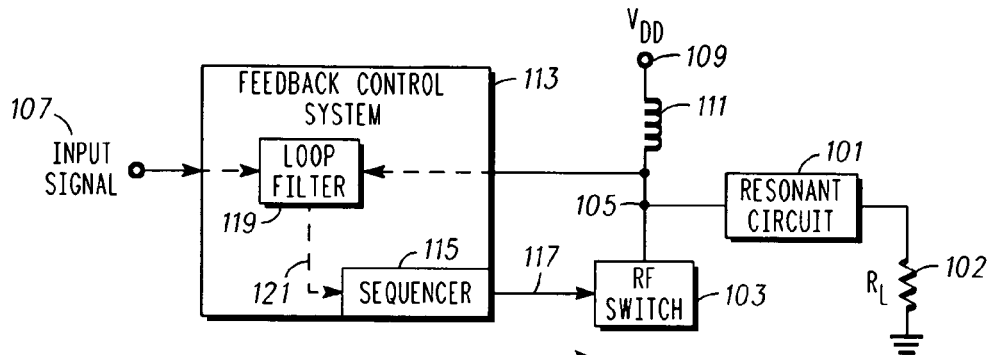
FIG. 1 depicts, in a simplified and representative form, a block diagram of a radio frequency power amplifier according to various exemplary embodiments.

In overview, the present disclosure primarily concerns communication equipment including radio frequency transmitters or amplifiers such as used in infrastructure equipment including base stations or in communications units. Such radio frequency amplifiers for example, may be found in cellular, two-way, and the like radio networks or systems in the form of fixed or stationary and mobile equipment. The fixed equipment is often referred to as base stations or transmitters and the mobile equipment can be referred to as communication units, devices, handsets, or mobile stations. Such systems and equipment are normally used to support and provide services such as voice and data communication services to or for such communication units or users thereof.

More particularly various inventive concepts and principles are embodied in systems or constituent elements, communication units, transmitters and methods therein for providing or facilitating radio frequency amplifiers or power amplifiers with dramatic improvements in efficiency and costs. Note that costs include costs associated with size and operational issues. The improvements are associated, for example, with power supplies and heat management issues as impacted by improved efficiency. The improvements also are reflected in lower component or production costs since the concepts and principles allow less expensive components, such as smaller transistors, to be used for higher power levels. The radio frequency power amplifiers advantageously use a feedback control system employing in some embodiments a version of a delta sigma modulator thereby advantageously yielding a practical and readily producible power amplifier provided such amplifiers are arranged and constructed in accordance with the concepts and principles discussed and disclosed herein.

The communication systems and communication transmitters that are of particular interest are those that may employ some form of complex modulation and that may provide or facilitate voice communication services or data or messaging services over wide area networks (WANs), such as conventional two way systems and devices, various cellular phone systems including but not limited to, CDMA (code division multiple access) and variants thereof, GSM, GPRS (General Packet Radio System), 2.5G and 3G systems such as UMTS (Universal Mobile Telecommunication Service) systems, 4G OFDM (Orthogonal Frequency Division Multiplexed) systems and variants or evolutions thereof.

The inventive concepts and principles described and discussed herein may be advantageously applied in any field where variable radio frequency power is required or appropriate. For example, certain medical, heating, lighting, and sensing applications may find the concepts and principles useful.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions.

Much of the inventive functionality and many of the inventive principles are best implemented with or in integrated circuits (ICs) such as application specific ICs or full custom ICs. It is expected that one of ordinary skill, notwithstanding possibly significant effort and many design choices motivated by, for example, available time, current technology, and economic considerations, when guided by the concepts and principles disclosed herein will be readily capable of generating such ICs with minimal experimentation. Therefore, in the interest of brevity and minimization of any risk of obscuring the principles and concepts according to the present invention, further discussion of such software and ICs, if any, will be limited to the essentials with respect to the principles and concepts of the exemplary embodiments.

FIG. 1 through FIG. 4 illustrate various embodiments of radio frequency power amplifiers that are arranged and constructed to operate in an inventive manner. The inventors refer to this type of power amplifier as a class M power amplifier. These power amplifiers provide replication and amplification of an input signal that includes modulation, such as amplitude modulation, phase modulation or complex modulation (amplitude and phase modulation) in a linear and efficient manner. Generally these radio frequency power amplifiers utilize a novel arrangement of a switching stage driving resonant circuits and a feedback control loop that operates to induce or control timing associated with switching of the switching stage so as to linearly replicate the complex modulation on a resultant load or amplifier output signal and encourage the switching at times when on average the voltage across the switching stage is at a minimum. Heretofore it has not been possible to drive a radio frequency switching stage so as to reproduce modulation with both good linearity and large degrees of modulation.

These radio frequency power amplifiers can advantageously be implemented as one or more integrated circuits. For example, the switching stage can be implemented in a high power density gallium arsenide, gallium nitride, silicon based power device, or the like process. For the feedback control loop or one or more constituent elements, a known high frequency submicron silicon based process may be advantageous.

Referring to FIG. 1, a block diagram of a radio frequency power amplifier according to various exemplary embodiments will be discussed and described. FIG. 1 shows a radio frequency power amplifier 100 that is arranged and configured to drive a resonant load including resonant circuit 101. The radio frequency power amplifier 100 will typically operate at frequencies from tens of Mega Hertz (MHz) to multiple Giga Hertz (GHz) and is generally utilized to amplify an input signal to provide a higher power load output signal. The resonant load as will be further described herein below is comprised of a combination of inductive and capacitive elements (the resonant circuit) and a load (shown as $R_L$ 102). $R_L$ 102 may include, for example, a harmonic filter, isolators, circulators, antenna, cable, or the like, that is driven by the resultant output or load output signal.

The radio frequency power amplifier 100 comprises a radio frequency switching stage 103 with an output 105 that is coupled to the resonant circuit 101 and configured to provide an output signal at output 105 with complex modulation, e.g., amplitude modulation (AM) and/or phase modulation (PM), corresponding to modulation of an input signal at input 107 when, for example, powered from a fixed voltage power supply, $V_{DD}$ 109, via, e.g., a feed inductor 111. The FIG. 1 embodiment of the radio frequency power amplifier 100 further comprises a feedback control system 113 that is coupled to the input (thus input signal 107) and the output 105 (thus output signal). Note that the input terminal or node and the input signal may alternatively be referred to as input 107 or input signal 107. Similarly the output 107 and output signal at 107 may alternatively be referred to as output 107 or output signal 107. The feedback control system 113 comprises a sequencer 115 that is configured to provide a sequencer output at output 117 that is used to drive the radio frequency switching stage 103. Advantageously, the sequencer output has an OFF state that begins at a variable time that corresponds to one or more of the output signal, the input signal, a combination of the output and input signal, or the like as will be further discussed below. The radio frequency switching stage 103 may be implemented in various forms, however it may be particularly advantageous when the switching stage together with the resonant circuit 101 is arranged as a radio frequency power amplifier in either a class E configuration or in a class F configuration.

The radio frequency power amplifier 100 of FIG. 1 and specifically the feedback control system 113 in one or more embodiments further comprises a loop filter 119. The loop filter 119 is responsive to the input signal and the output signal via the inter coupling as shown and the loop filter is configured to provide a filtered signal at 121. The sequencer 115 is responsive directly or indirectly to the filtered signal at 121. For a given embodiment of a sequencer there will normally be a defined relationship between the operation of the sequencer and the output signal from the loop filter, e.g. rising edge zero crossings of the loop filter signal trigger the sequencer. The loop filter may be, e.g., an nth order (n=1, 2, 3, . . . ) band pass filter, or an nth order low pass filter depending on other particulars of the feedback control system. For example, if the input signal is at or centered at a desired carrier frequency (e.g., 900 MHz, 2.4 GHz, etc) or some other frequency, such as an intermediate frequency, that is above 0 hertz, a band pass filter may be advantageous. Alternatively if the input signal is centered at 0 hertz or a relatively low frequency, e.g. a base band frequency, relative to the carrier frequency, a low pass filter can be more useful. In the latter case or where the input signal is not centered at the carrier frequency, a mixer arrangement can be employed to provide a feedback signal where the feedback signal corresponds to the output signal as down converted by the mixer arrangement and provide a sequencer input corresponding to the filtered signal, i.e., in some embodiments a combination of the input signal and the feedback signal, as up converted by the mixer arrangement.

Figure 2:
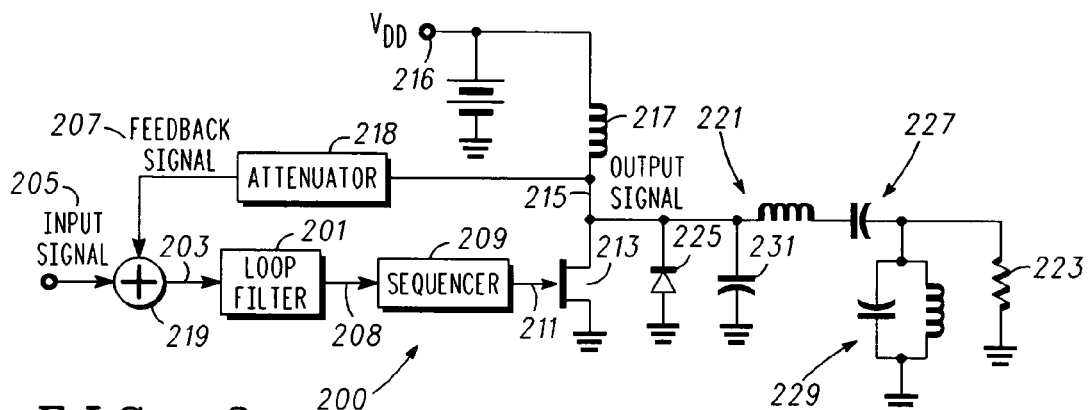
FIG. 2 depicts, in a simplified and representative form, a more detailed block diagram of a radio frequency power amplifier according to one or more exemplary embodiments.

Referring to FIG. 2, a more detailed block diagram of a radio frequency power amplifier according to one or more exemplary embodiments will be discussed and described. In FIG. 2, a radio frequency power amplifier 200 comprises a loop filter 201 with an input 203 coupled to a signal corresponding to an input signal 205 and a feedback signal 207. Note that the feedback signal 207 and the terminal or node where the feedback signal is found will alternatively be referred to by reference numeral 207. In this embodiment where the input signal has (or is centered about a frequency equal to) the desired output carrier frequency, the loop filter 201 will normally be a relatively high gain nth order band pass filter, with n=1, 2, 3, . . . Further included is a sequencer 209 that is coupled to an output terminal 208 and responsive to a filter output or filter output signal from the loop filter 201 and configured to provide a sequencer output at output 211. The sequencer output has an OFF state with a starting time that corresponds to the filter output as will be further discussed below.

Additionally included is a radio frequency switching stage 213 that is driven by the sequencer output and configured to provide an output signal at 215. As shown in one or more embodiments the switching stage is supplied DC (direct current) power from a constant voltage source $V_{DD}$ 216 via a feed inductor 217. The output signal is coupled via an attenuator 218 back to be combined with the input signal at summer 219. Thus, the feedback signal corresponds to the output signal. The summer 219 provide the signal at 203 to the loop filter 201, i.e., the signal coupled to the input of the loop filter can be an error signal corresponding to an algebraic combination of the input signal and the feedback signal. The radio frequency switching stage in one or more embodiments is a field effect transistor (FET or JFET) but may also be a bipolar transistor or the like. In some embodiments the FET or JFET is formed using known GaAs (gallium arsenide), GaN (gallium nitride), LDMOS (Laterally Diffused Metal Oxide Semiconductor) process technology as noted earlier. Note that while the switching stage is shown as one transistor a plurality of transistors may be used essentially in parallel to perform the switching function. Note also that appropriate circuitry, such as additional gain stages will be needed, either as part of the sequencer or switching stage in order to insure that the switching stage is properly driven.

Those of ordinary skill will recognize that if the sequencer 209 provides a quantized output, i.e. a finite number of fixed levels or states, the amplifier of FIG. 2 (or FIG. 1 and others) has an architecture similar to a delta sigma (alternatively sigma delta) converter. However, the operation and function of the sequencer is distinctly different for a number reasons including for example asynchronous operation or quasi asynchronous operation (i.e., not synchronized to a fixed clock) where the states of the sequencer correspond to states of the output signal, input signal, or output from the loop filter.

The output signal at 215 is applied to a resonant circuit 221 and via the resonant circuit 221 to a load 223. Placed across the switching stage 213 is a diode (catch or snub diode) 225 that is configured and operates to clamp the output signal to a voltage that is non-negative, i.e., essentially at ground potential. Note that diode 225 may be a parasitic diode, e.g., source to substrate diode or the like for the switch 213, or the switch itself may turn on or be turned on when the voltage is at or below ground. The resonant circuit 221 includes a series resonant inductor capacitor pair 227 that couples the output signal as filtered by the series resonant pair 227 to the load 223. Across or in parallel with the load is a parallel resonant inductor capacitor pair 229. Further included in the resonant circuit 221 is a capacitor 231 that is coupled in parallel with the switching stage 213.

Those of skill in the field will recognize the switching stage together with the resonant circuit as shown and described is arranged in a class F configuration. Alternative embodiments of the switching stage and the resonant circuit can be arranged in a known class E configuration (for example, eliminate the parallel inductor capacitor pair 229). Other architectures for class F or class E exist and may also be utilized. Class E and F power amplifiers while taking advantage of the open or short circuit zero power dissipation characteristics also recognize that in practice the switching stage takes a finite time period to change between these states and if both voltage and current are non-zero during the time period between states, power will be dissipated. Thus these configurations strive to perform switching between states during those times when the voltage of the output signal is ideally zero volts and furthermore if possible when the derivative of this voltage is also zero, i.e. switching currents will also be zero. In practice with class E or class F these conditions can only be approached and then only when the output signal is at or nearly at a predetermined amplitude or power level for a given $V_{DD}$ level.

Thus when amplitude modulation must be reproduced or included in the output signal, known class E and class F configurations are typically inefficient and exhibit poor linearity. In stark contrast, the radio frequency power amplifiers, i.e. class M radio frequency power amplifiers, as disclosed herein are arranged such that the radio frequency switching stage as driven by the sequencer output is configured to provide an output signal including complex modulation (AM or PM) as imposed on the input signal while, for example, powered from a constant voltage power supply with reasonable efficiency and linearity performance.

Figure 3:
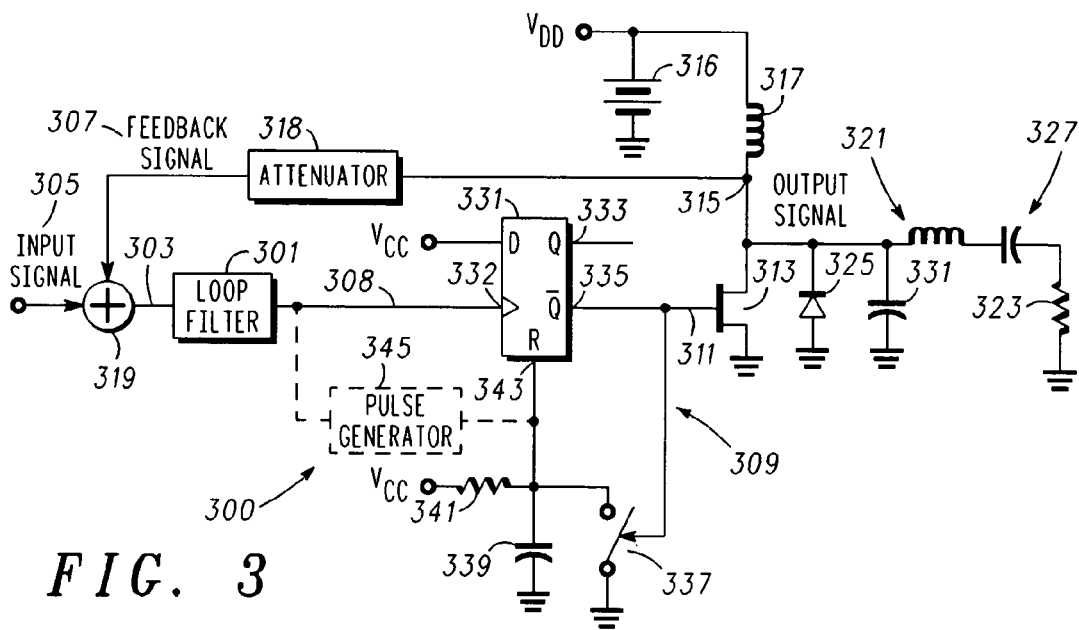
FIG. 3 illustrates, in a simplified and representative form, a more detailed block diagram of a radio frequency power amplifier including one embodiment of a sequencer according to one or more exemplary embodiments.

Referring to FIG. 3, a more detailed block diagram of a radio frequency power amplifier 300 including one embodiment of a sequencer will be discussed and described. The radio frequency power amplifier 300 functionally includes many of the same entities as FIG. 1 or FIG. 2. and thus this description will not dwell on most of them. The radio frequency power amplifier 300 includes a loop filter 301 (normally nth order band pass filter in this embodiment) with an input 303 coupled to a signal corresponding to an input signal 305 and a feedback signal 307. Further included is a sequencer 309 that is responsive to a filter output, e.g., via an input 308, from the loop filter 301 or loop filter output signal. The sequencer 309 is configured to provide a sequencer output at output 311, where the sequencer output has an OFF state with a starting time that corresponds to the filter output (i.e., there is a defined relationship between the filter output and operation of the sequencer and thus sequencer output). Additionally included is a radio frequency switching stage 313 driven by the sequencer output and configured to provide an output signal at output 315 that is coupled via the attenuator 318 to the summer 319. Thus, the feedback signal corresponds to the output signal. Note the OFF state corresponds specifically to switching stage 313 being opened or in a high impedance state, i.e., OFF state.

The radio frequency switching stage 313 can be powered from a constant voltage supply 316 via a feed inductor 317 and is coupled to and drives a resonant circuit 321 comprised of a series resonant inductor capacitor pair 327 and capacitor 331 that operates to filter the output signal and drive a load 323. A catch or snub diode 325 is located as shown in parallel with the switching stage. The switching stage 313 with the resonant circuit 321 will be recognized as a radio frequency amplifier that can as known be arranged in a class E configuration with appropriate values of the inductors and capacitors.

The sequencer 309 further comprises a flip flop, such as a D flip flop 331 or other appropriately arranged flip flop or the like that is clocked, for example, from the filter output at input 308. The sequencer 309 is configured to provide the sequencer output in the OFF state (low or zero volt state) when triggered by the filter output, i.e., the OFF state has a starting time that corresponds to the filter output. Note in this embodiment, when the output signal at 308 from the loop filter 301 crosses a switching threshold at a clock input 332 of the D flip flop, the Q output 333 goes high (Vcc since the D input is tied to Vcc) and the Q bar output 335 goes low. When the Q bar output 335 or sequencer output at 311 goes low, a switch 337 is opened.

This allows a capacitor 339 to begin charging toward Vcc through a resistor 341. The junction of the capacitor and resistor is coupled to a Reset input 343. When the capacitor has charged to the Reset threshold of the D flip flop 331 at a time determined by the RC time constant of resistor 341 and capacitor 339, the D flip flop will be reset and the Q bar output will go high, the switch 337 will be closed holding the Reset input at a low potential, and the sequencer will thus provide the sequencer output at 311 in an ON state after a time lapse determined by the Reset signal (in this embodiment the RC time constant) for the D flip flop. Note that this sequencer 309 is often referred to as an edge triggered one shot. It has been found that a time lapse on the order of a half cycle of the radio frequency carrier can be an appropriate time duration for the OFF state, e.g., at 1000 MHz, approx 0.5 nanoseconds. Note that after the D flip flop has been reset, when the filter output again goes high the sequencer 309 will again provide an output in the OFF state.

Note that when the sequencer output is in the OFF state, the switching stage is an open circuit, i.e., stage is turned OFF, and the resonant circuit 321 may be charging up through the feed inductor 317 thus causing a positive going pulse in the output signal at 315. Conversely when the sequencer output is in the ON state, the switching stage is a short circuit, i.e., the switching stage is turned ON, the output signal at 315 is approx zero volts, and the resonant circuit 321 may be discharging through the switching stage. These and other relationships between waveforms in the FIG. 2 embodiment of the radio frequency power amplifier will become clearer with the discussion of simulation waveforms below where FIG. 5 through FIG. 14 are referenced.

For high-frequency operation, an appropriate sequencer operates in an asynchronous manner, i.e. there is no clock as in conventional architectures. Note that for reasonable efficiency when reproducing input signals it is necessary that the sequencer output produce a drive signal for the class E/F amplifier that is compatible with its requirements, e.g., switching at or near zero voltage, etc. This normally means that the sequencer will need to switch at or near the carrier frequency and that the sequencer will need to vary or modulate the timing of its switching decisions with a resolution that is fine in comparison with the period of the carrier, e.g. at ⅛ or smaller increments of the period. This is in stark contrast to conventional feedback architectures, such as sigma-delta architectures, which are synchronized to a clock that is independent from and thus whose phase relationship to the carrier is essentially random.

Thus, the sequencer 309 (and 209, 115) should, in embodiments where efficiency is desired, be configured to provide the sequencer output with a second state, e.g., ON state, that has a starting time corresponding to, e.g., at or near to or on average at or near to, a voltage minimum for the output signal as will become more evident with the review of the simulation waveforms below. As discussed above, the sequencer in certain embodiments is configured to provide the sequencer output where the OFF state has a minimum time duration (e.g., determined by the RC time constant) and the sequencer output further has an ON state having a variable time duration (in the described and various embodiments the ON state once it begins will last until the output of the loop filter triggers the D flip flop). In the embodiment noted above, the sequencer is configured to provide the sequencer output with an OFF state having a predetermined time duration, i.e., a time duration determined by the RC time constant.

Note that other embodiments may use a sequencer that is configured to provide the sequencer output with an OFF state having a variable time duration where the variable time duration is equal to or greater than the minimum time duration. For example a pulse generator 345 (optional) that is triggered by a positive going output or some predetermined state from the loop filter to provide a negative going pulse at the Reset input and otherwise provide an open circuit will discharge capacitor 339 and thus provide a variable time duration for the OFF state. Note that the switch and RC circuit coupled to the Reset input of the D flip flop may be viewed as a edge triggered one shot, where as with the addition of the pulse generator 345, this may be viewed as an edge triggered re-triggerable one shot.

Thus in the sequencer using the optional pulse generator 345, the sequencer can be configured to provide the sequencer output in the OFF state when the filter output corresponds to a predetermined state (the clock level for the D flip flop) and to provide the sequencer output in the ON state after a time lapse that is variable and that corresponds to the minimum time duration starting at the last occurrence of the predetermined state. As noted above, the sequencer is configured to provide the sequencer output asynchronously, i.e., the sequencer is clocked by the loop filter output or the control loop may be viewed as self clocked. Note that the sequencer may also be viewed as clocked by the output signal (drain voltage) as that ultimately determines the filter output signal, for a given input signal.

In a further alternative embodiment, not specifically depicted, an envelope detector monitors the input signal and when an envelope level of around 20% of the peak envelope is detected will operate a switch. The switch would add an additional capacitor in parallel with capacitor 339. If the additional capacitor had a capacitance that was, e.g., 2 times that of capacitor 339, the time constant would be about 3 times the initial time constant and this would extend the OFF state to approximately 3 times the original. The net result is the duty cycle of the switching stage is reduced when signal levels are low, the current in the feed inductor is reduced, and this ultimately results in reducing power consumption of the switching stage.

Figure 4:
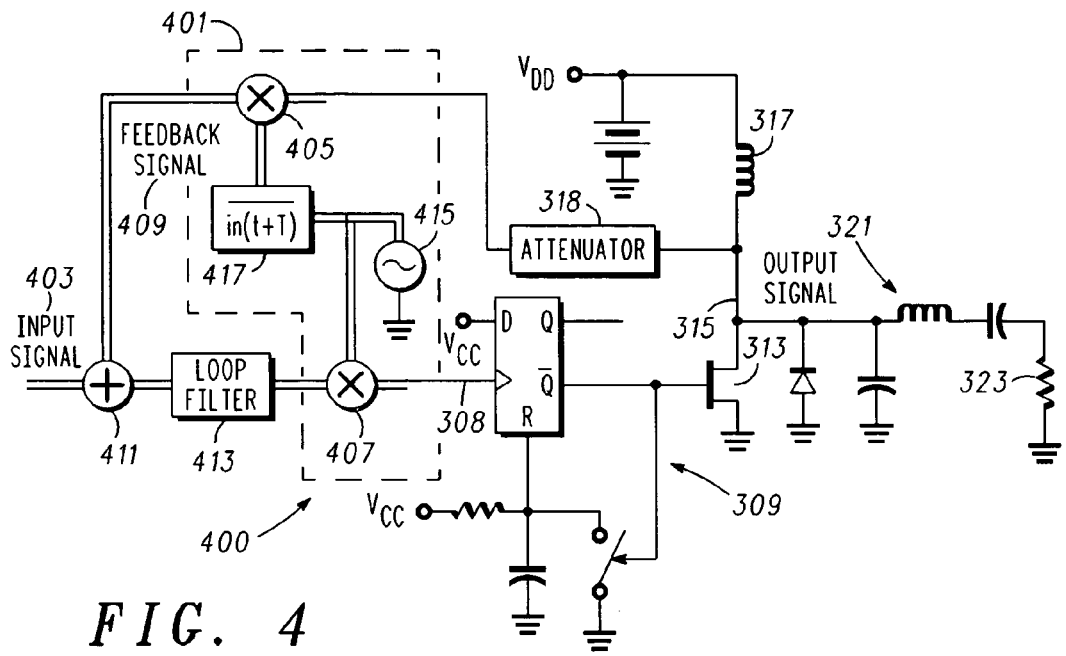
FIG. 4 depicts, in a simplified and representative form, a more detailed block diagram of a radio frequency power amplifier similar to that of FIG. 3 but including a mixer arrangement according to one or more exemplary embodiments.

Referring to FIG. 4, a more detailed block diagram of a radio frequency power amplifier similar to that of FIG. 3 but including a mixer arrangement will be discussed and described. In FIG. 4, the radio frequency power amplifier 400 includes in addition to the sequencer 309, switching stage 313, resonant circuit 321, attenuator 318, etc., a mixer arrangement 401. The sequencer 309, switching stage 313, resonant circuit 321, attenuator 318, etc. operate in accordance with previously discussed principles and concepts although they may be adjusted, etc. to accommodate the particulars associated with the embodiment of FIG. 4. The radio frequency power amplifier 400 of FIG. 4 is arranged and constructed to receive an input signal 403 at a base band frequency, such as zero hertz or another intermediate frequency that is typically relatively low compared to the carrier frequency of the signal that is to be transmitted, frequency translate or up convert the input signal to a carrier frequency and amplify the resultant up converted signal to provide an output signal that is filtered and coupled as resultant signal to the load. The output signal will be at the carrier frequency and will include modulation corresponding to the input signal. Note that the input signal 403 is a complex signal with I (in phase) and Q (quadrature) components where the double lines in FIG. 4 are used to denote complex signals having I and Q components.

The mixer arrangement 401 includes linear I/Q mixers 405, 407 (e.g., Gilbert cell arrangements) and is configured to provide the feedback signal 409, where the feedback signal corresponds to the output signal at 315 as frequency translated or down converted to the frequency of the input signal by the mixer arrangement or more specifically mixer 405. The feedback signal 409 is combined with the input signal 403 in the summer 411 with the resultant complex signal coupled to a loop filter 413. The complex conversion is a multiple mixer complex conversion providing two outputs coupled to two inputs of the filter so as to provide image rejection without undue delay as discussed in Section 9 of a University of Toronto, Department of Electrical Engineering Doctoral Thesis titled *Intermediate Function Synthesis*, authored by Snelgrove in December 1981, hereby incorporated herein. The mixer arrangement further provides a sequencer input at input 308 that corresponds to the filter output or output signal from the loop filter 413 as frequency translated or up converted by the mixer arrangement 401, specifically mixer 407 to the carrier frequency. Note that only one of the complex signal components from mixer 407 is needed to drive the sequencer. In particular, the Q or imaginary component has been utilized.

Thus the sequencer input or input signal corresponds to a combination of the input signal and the feedback signal as filtered and up converted. Note that the mixer arrangement may be viewed as part of the feedback control system of FIG. 1. Generally when the input signal is at base band, i.e. centered at DC or zero frequency, the loop filter may be advantageously implemented as a low pass filter and when the input signal is centered at another, e.g., intermediate, frequency the loop filter is normally implemented as a band pass filter centered at the intermediate frequency. Since the filter is handling complex signals both the I and Q component will need to be filtered prior to presentation to the mixer 407. In either situation the loop filter is configured to filter the combination of the input signal and the feedback signal. Using the mixer arrangement, while adding an apparent level of complexity, allows the loop filter to be implemented at a lower frequency and thus may allow for a more exacting or higher precision filter to be implemented/provided at lower costs. Using frequency translation in the feedback control system allows the input signal to be presented at base band and thus may eliminate the frequency translation at some other place in a typical transmitter lineup.

The mixer arrangement in addition to the mixers 405, 407 includes a local oscillator 415 that provides a local oscillator signal at a frequency equal to the carrier plus or minus the center frequency of the input signal. Thus if the input signal is at or centered at DC the local oscillator oscillates at the carrier frequency and otherwise at the carrier frequency plus or minus the intermediate frequency. The local oscillator signal is coupled to both mixers, however the signal coupled to mixer 405 is time-shifted or phase delayed by the phase shifter 417. The phase shifter 417 in some embodiments delays the oscillator signal to mixer 405 by approximately one-quarter cycle (at the carrier frequency) and forms the conjugate phase (the sign of the gain for the Q channel in the down conversion mixer 405 is opposite to the sign for the Q channel in the up conversion mixer 407) for the oscillator signal applied to the mixer 405 as compared to the signal applied to the mixer 407. The time shift can be selected or adjusted to compensate for time delays in the feedback control system or loop.

Time domain simulations of the radio frequency power amplifier 400 of FIG. 4 have been conducted using PC based circuit design and simulation software. For illustrative purposes, the system that was simulated produced a modulated output signal nominally centered at 100 MHz and processed an information signal comprised of 4 sinusoids arbitrarily spaced across a bandwidth of 1.25 MHz. The 4 sinusoid information signal is representative of the system processing an arbitrary wideband signal having a 6 dB peak-to-average power ratio. In addition, the switching stage 313 was a GaAs FET having a 9 mm gate width, and $V_{DD}$ 316 was set to 12 volts. During the course of executing the simulations, system performance, i.e. signal-to-noise ratio, output load power efficiency and absolute output load power, was optimized by changing component values in an iterative manner through the application of electrical engineering principles. A signal-to-noise ratio of approximately 50 dB over a 1.25 MHz bandwidth, a power efficiency of 27% and an output load in band signal power of 3.8 Watts was achieved by setting the respective components to the values noted below. The element values were; a feed inductor 317 of 100 nH (nano-henrys), a capacitor 331 of 100 pF (pico-farads), a series resonant inductor capacitor pair 321 of 11 nH and 250 pF, respectively, and a load 323 of 3 Ohms.

In contrast to these results, a Class A amplifier in an equivalent comparison circuit, with the same input signal and output signal power and linearity would achieve a power efficiency of approximately 7 to 8 percent. Note that further optimization work may yield different performance results and component values. One of ordinary skill will realize that more detailed models may be required and that different performance values may be obtained, for example, at higher frequencies.

Figure 5:
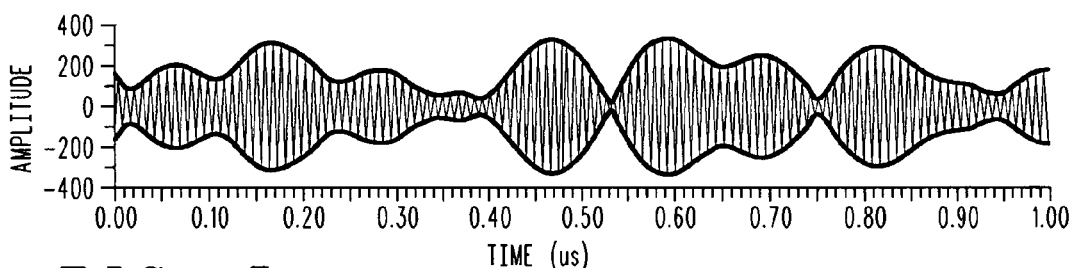
Figure 6:
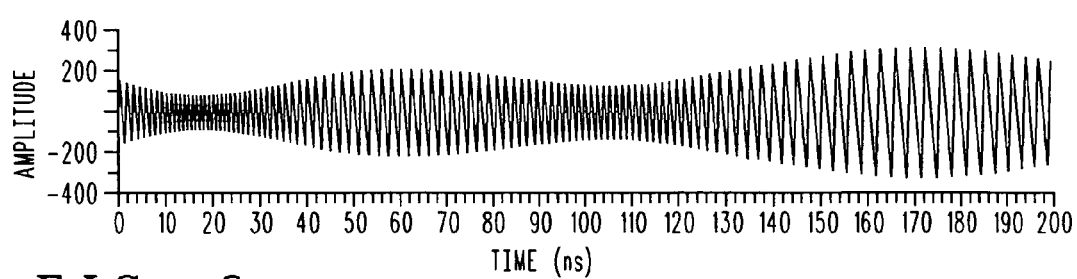
Figure 7:
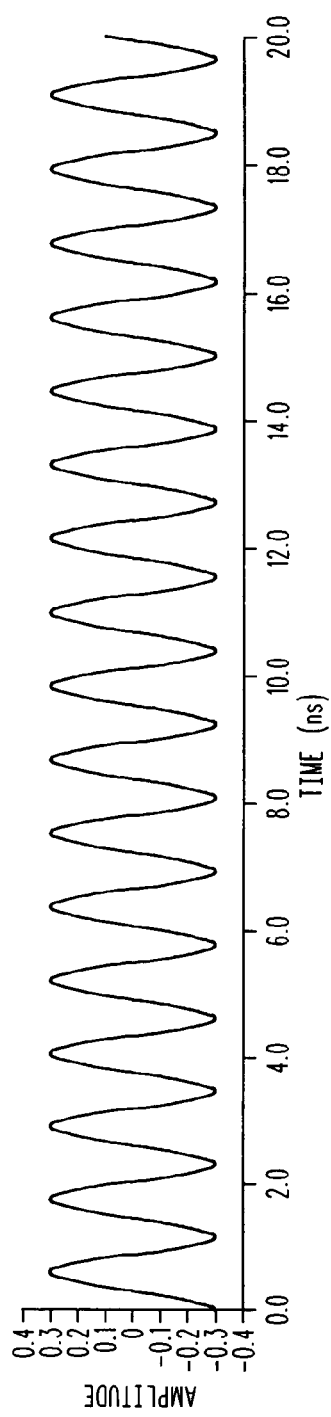

Referring to FIG. 5 through FIG. 14, various representative waveforms captured from an experimental simulation of a radio frequency power amplifier in accordance with the embodiment depicted in FIG. 2 will be discussed and described. Note that the input signal in FIG. 2 is centered at the carrier frequency. FIG. 5 shows the input signal 205 over a one micro second (1 µs) time period. Note that the input signal envelope demonstrates that the input signal includes amplitude (AM) modulation where the envelope varies from approx 300 mille-volts to near zero in some instances with an approximately 6 dB peak to average ratio. Note also that the input signal includes phase modulation, i.e., PM, that is not particularly evident. The input signal is similar to that found for example, in code division multiple access (CDMA) systems, such as wideband CDMA systems. FIG. 6 shows the same input signal over the first 200 nano seconds (200 nsec) where again the AM modulation is clearly evident. FIG. 7 shows a 20 nsec portion of the input signal where the carrier signal (approximately 875 MHz) is evident, however given the time scale and the particular portion of the input signal little if any AM or PM modulation is evident.

Figure 8:
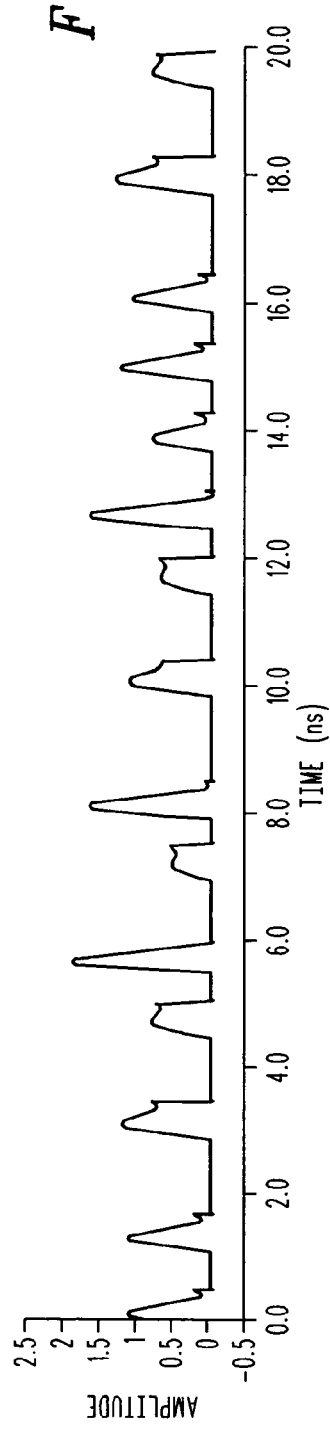
Figure 9:
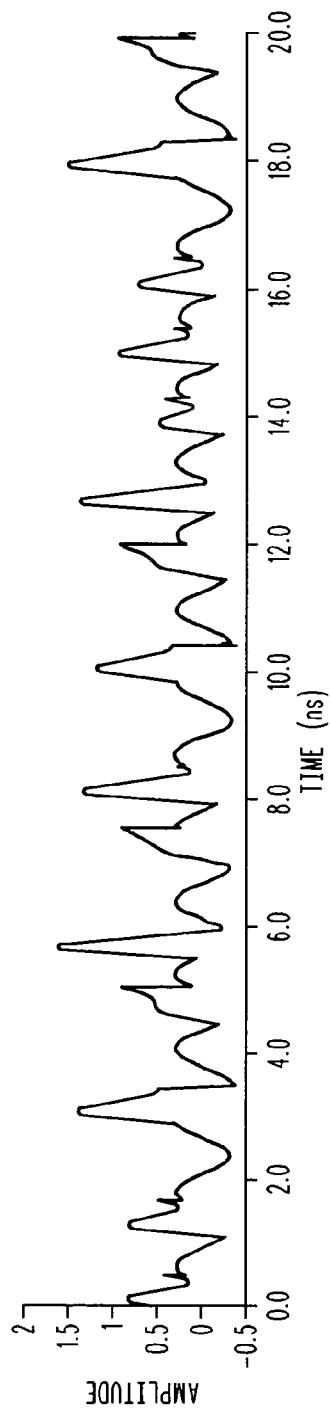

FIG. 8 shows the feedback signal 207 over the same 20 nsec time period. This feedback signal corresponds to the output signal at 215. Each of the pulses arise when the sequencer 209 enters the OFF state and the switching stage 213 becomes an open circuit. The feed inductor 217 and resonant circuit 221 as well as charge states (conditions at time OFF state starts) for each of the elements determine the particular form of the respective pulses. The pulses end when the sequencer enters the ON state and the switching device becomes a short circuit. The input signal and the feedback signal are combined in the summer and yield the waveform of FIG. 9. Note that the switching stage provides a phase inversion, so the waveform of FIG. 9 is essentially the sum of the input and feedback signals. This is the waveform that is input to the loop filter at input 203.

The loop filter is typically a bandpass filter as earlier noted and as will be further described below. The output of the loop filter is shown in FIG. 10. The waveform of FIG. 10 is coupled to the sequencer 209 at input 208. The sequencer output signal at 211 is shown in FIG. 11. The sequencer output signal is a quantized signal that in this embodiment includes an OFF state (output signal is low at −1 volts and switching stage is essentially an open circuit or OFF) and additionally an ON state (output signal is high at 0 volts and switching stage is essentially a short circuit or ON), with each state occurring multiple times. Note that rising edges 1001 in FIG. 10 result in the sequencer entering the OFF state 1101 and the OFF state in the particular embodiment of FIG. 11 (see 309 in FIG. 3) lasts for a minimum time period of approximately T/2 1103 (i.e., a half-cycle of the carrier frequency). Thus the sequencer output includes an OFF state that begins at a variable time that corresponds to the filter output or corresponds to the output signal. Note that rising edges at the output of the filter that occur while the sequencer is in the OFF state (e.g., 1003) have no impact in this embodiment. However in alternative embodiments where the optional pulse generator 345 or similar functionality (e.g., re-triggerable one shot) is used, the OFF state can be extended by the length of time between the two successive rising edges. It is also noted that the frequency of occurrence of the OFF state varies from one time period to another as readily observed from FIG. 11 and also varies from the frequency of the input signal (see FIG. 7).

FIG. 12 shows the output signal at 215, i.e., at the drain of the switching stage 213, that results given the sequencer output signal of FIG. 11. It will be observed that pulses, e.g., 1201, are generated whenever the sequencer is in a corresponding OFF state, e.g., 1103 and these pulses are reaching amplitudes of 20 to 40 volts. Pulses end or are terminated whenever the sequencer starts or initiates an ON state, e.g., 1203, and the switching stage becomes a short circuit. Note that the ON state is initiated at a starting time that corresponds to a voltage minimum in the output signal. For example, pulses 1205 are terminated near a voltage minimum and for these pulses as readily observed just shortly after the voltage minimum. As another example, pulses 1207 by observation are terminated near a voltage minimum and for these pulses near zero volts across the switching stage.

Those familiar with class F or class E power amplifiers will note that normally these stages are designed to and typically will switch at near zero volts (pulses 1207) across the switching stage, thereby minimizing power dissipation in the switching stage. However class F or class E in order to consistently switch near zero volts have to provide near a maximum output power given the voltage supply, $V_{DD}$, for the switching stage and other design values, i.e. class E and class F are not normally capable of AM modulation or PM modulation of more than very small deviations without degrading either efficiency or linearity. In the embodiment simulated above, the class F amplifier is driven to replicate AM and PM modulation on the input signal, e.g. provide an output signal that is often less than the maximum output given a particular voltage supply, $V_{DD}$ 216, as well as replicate PM modulation. One of the artifacts of reproducing AM and PM modulation using the power amplifier of FIG. 2 is occasionally closing the switching stage when the output signal is not near zero volts, e.g., pulses 1205. In these instances, power will be dissipated by the switching stage at least during the switching time when both voltage and current are non-zero.

However this dissipation can be minimized by turning the switching stage ON when the output signal voltage is near a minimum voltage as depicted by many of the pulses in FIG. 12 and particularly pulses such as pulses 1205. Note that other 20 nsec segments of waveforms such as those of FIG. 5 through FIG. 12 may show many of the output pulses being terminated at near zero voltage or many of the output pulses being terminated earlier than the minimum output voltage. If the pulses are terminated near a minimum voltage the resultant efficiency will be close to the best efficiency available from the class F or class E power amplifier driven to replicate complex modulation including AM and PM modulation using the feedback control systems variously described above. For example, if the efficiency does not suffer more than 15% as a result of the specific time (before or after minimum voltage) that the output pulses are terminated (switching stage enters ON state), the starting time of the second or ON state may be viewed as near to or corresponding to a voltage minimum for the output signal. Note also that the switching stage when driven by the sequencer in the feedback control system may turn the switching device ON at a point that is not close to a voltage minimum for a particular pulse in order to provide near optimum turn on times for many successive pulses. In essence, if on average the pulse are being terminated near a voltage minimum efficiency will near an optimum value given that AM and PM modulation is being imposed on a carrier signal by a class E or class F power amplifier.

Figure 13:
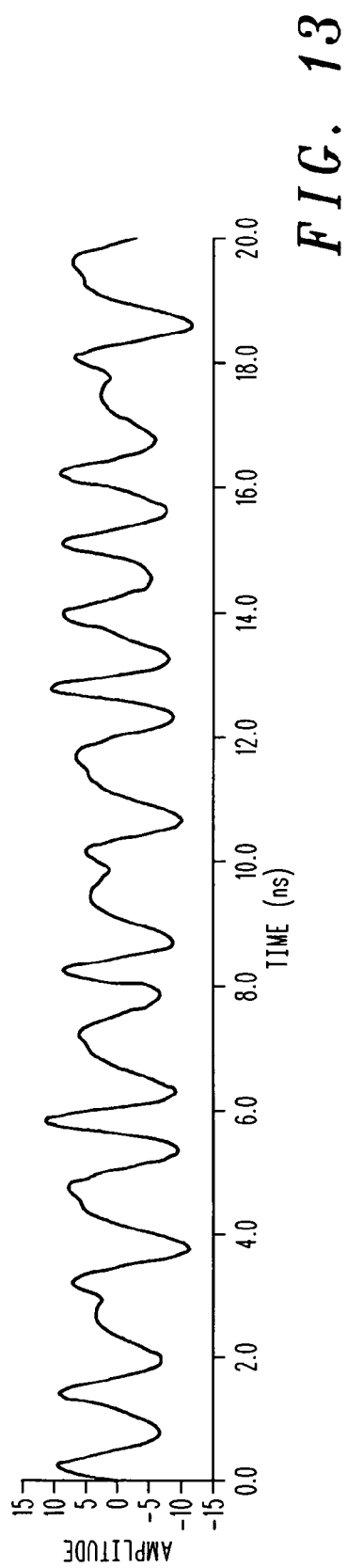
Figure 14:
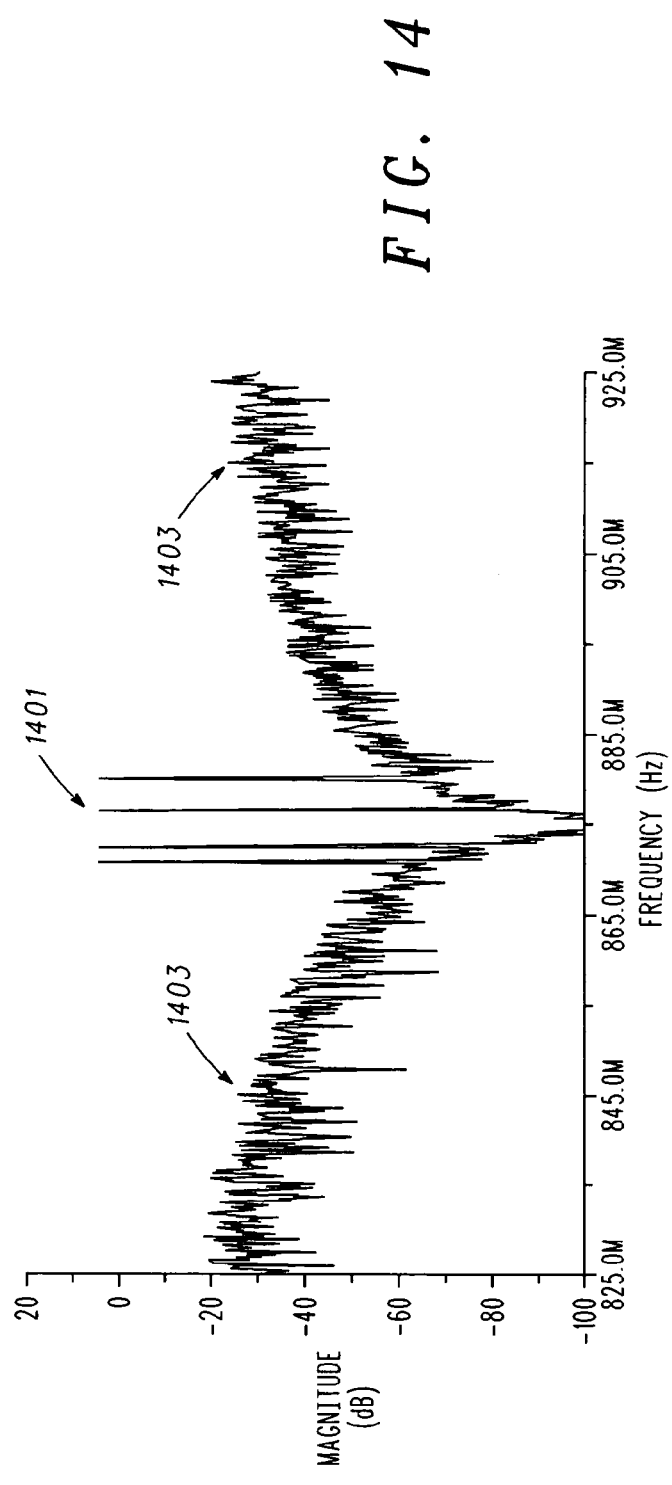

FIG. 13 shows a waveform of the voltage across the load 223 that results from the output waveform of FIG. 12 with amplitudes around 10 or so volts. This waveform includes significant amounts of essentially switching or quantization noise as well as $2^{nd}$ and higher order harmonics that may be readily removed with an appropriate harmonic filter, e.g. a band pass radio frequency filter, before applying the resultant signal to an antenna or cable or the like. FIG. 14 shows a close in frequency spectrum of the waveform of FIG. 13. This spectrum is centered at a frequency near 875 MHz and shows desired sidebands 1401 clearly indicative of AM and PM modulation components as well as the undesirable quantization noise 1403 noted above. Note that in band, the quantization noise is down by 55-60 dB in the 10 MHz bandwidth centered at the carrier frequency.

Generally the particular implementation of a sequencer will depend on a multitude of factors including the switching stage, feed inductor, resonant circuit(s), feedback path and loop filter gain and phase parameters. The sequencer should be implemented such that given all of the other parameters the sequencer output is provided in the proper state and at the proper time and for the proper time duration to cause the switching stage to turn ON or OFF so as to generate an output signal that when fed back and combined with the input signal will drive the output of the loop filter toward zero. This may be referred to as generating a counter phase or opposing phase loop filter output.

Figure 15:
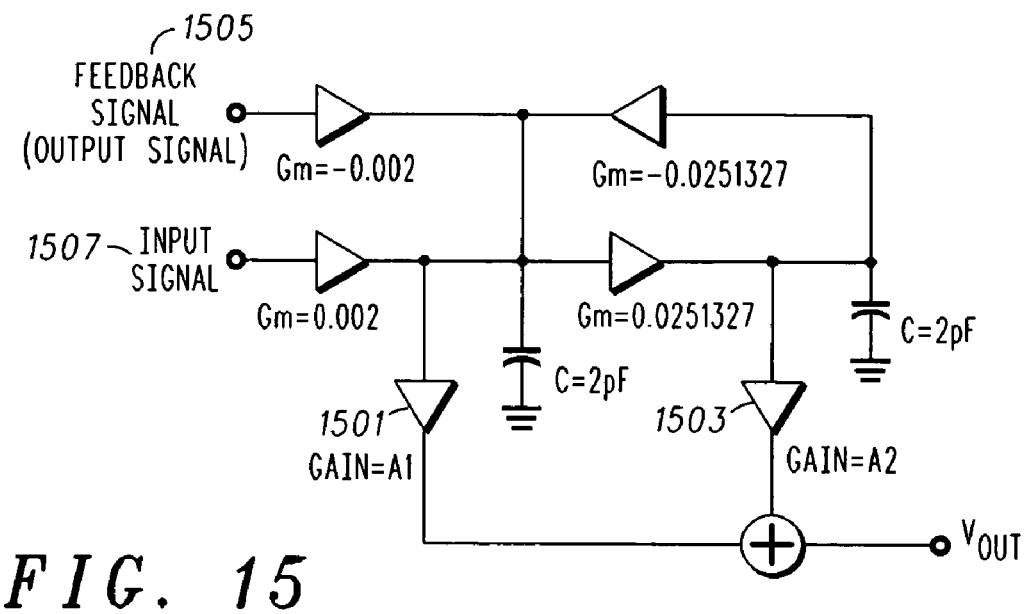
FIG. 15 depicts, in a simplified and representative form, a block diagram of a loop filter suitable for use in one or more embodiments of a radio frequency power amplifier.

Referring to FIG. 15, a block diagram of a loop filter suitable for use in one or more embodiments of a radio frequency power amplifier will be discussed and described. The loop filter of FIG. 15 is a known transconductance capacitor (gm-C) filter that is shown in a generalized form, i.e., the filter can be a low pass or band pass filter depending on the selection for gains A1, A2 1501, 1503. For example, if A1 is set to unity (1) and A2 to zero (0) a band pass filter results. As shown the filter has two inputs, namely the feedback signal 1505 and input signal 1507 (analogous, e.g., to output signal at 105, 215, 315 and input signal 107, 205, 305, 403). Note that the filter of FIG. 15 is also acting as the summer in FIG. 2-FIG. 4.

The filter of FIG. 15 when implemented as a band pass filter with the values of gm and C shown, A1=1, and A2=0, has a center frequency of 2 GHz and a theoretically infinite Q (i.e., not limited by an impedance at the output of the gm blocks). The roll off characteristic on either side of the center frequency is 20 dB per decade. Note that this filter may be frequency scaled to any value of interest (carrier frequency or intermediate frequency) according to known techniques, e.g. increasing the capacitor values will lower the center frequency. The values of A1 and A2 can be selected/adjusted to tune and optimize the system performance of the radio frequency power amplifier and thus account for circuit parasitics and various other non-idealities. Generally it has been found that adjusting these values can improve signal to noise performance with limited impact on efficiency. Various classes of bandpass filters can be employed to realize the loop filter when a band pass version is needed. A fourth order filter may be used in embodiments of a radio frequency power amplifier with a non-DC centered input signal, where the filter has a transfer function of the form:

$$L(s) = \frac{(-0.496s^3 - 0.0609s^2 - 4.896s + 1.615)}{(s^2 + \pi^2)^2}$$

Note that this filter has a resonant or center frequency of 0.5 Hz but may be frequency scaled in accordance with known techniques. While this filter is known to work appropriately, there are various other appropriate filter transfer functions.

Figure 16:
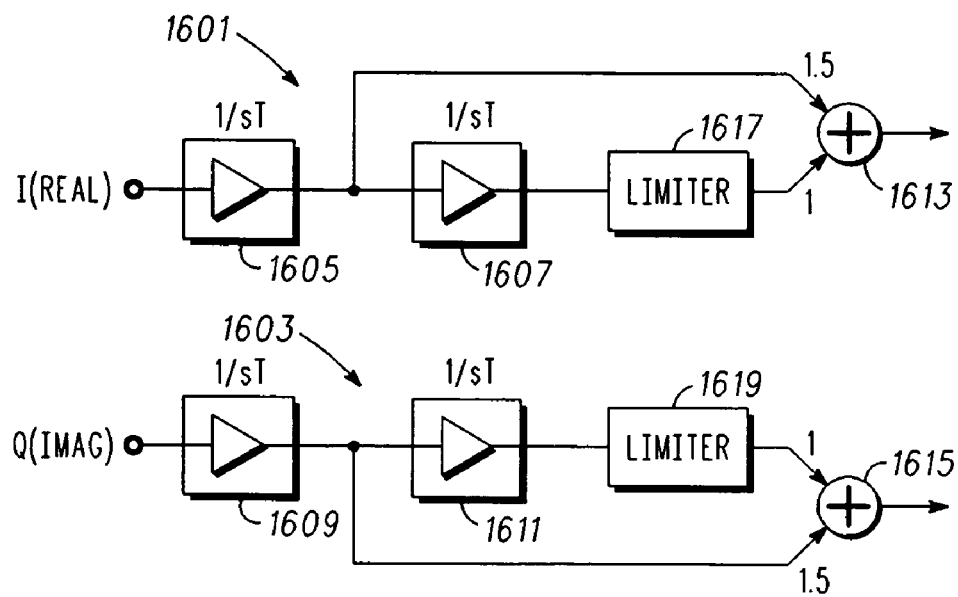
FIG. 16 depicts, in a simplified and representative form, a block diagram of another loop filter suitable for use in one or more embodiments of a radio frequency power amplifier.

When the radio frequency power amplifier uses frequency translation and down converts the output signal to a base band frequency corresponding to an input signal centered at DC a low pass filter will normally be used. This may be comprised of single integrator stages, one for a real (I) path and one for an imaginary (Q) path. Higher order filters may also be used, such as the filter depicted in FIG. 16. Recalling the discussion of FIG. 4, the loop filter needs to filter a complex signal and thus includes a real path 1601 and an imaginary path 1603. Here the single integrators noted above are replaced by a second order function using, for example, two integrators 1605, 1607 or 1609, 1611 plus a summer 1613 or 1615. Each of the I and Q filters has a transfer function of the form $(1.5sT+1)/(sT)^2$ as depicted. Note that the output of the second integrator is applied to a limiter 1617, 1619. This is a means for limiting the maximum contribution of the "momentum" term $1/(sT)^2$. This term is one mechanism that may contribute to instability. Clipping this term does not ordinarily limit the intended operation of the filter when, for example, clipping levels are set at 4 standard deviations. Other stabilization techniques may be applied such as clipping other integrator outputs or nulling integrator outputs if the overall output from the filter is too large or does not change sign for too many samples. Note that the output of the summers 1613, 1615 is used to drive the complex mixer 407 in FIG. 4.

Figure 17:
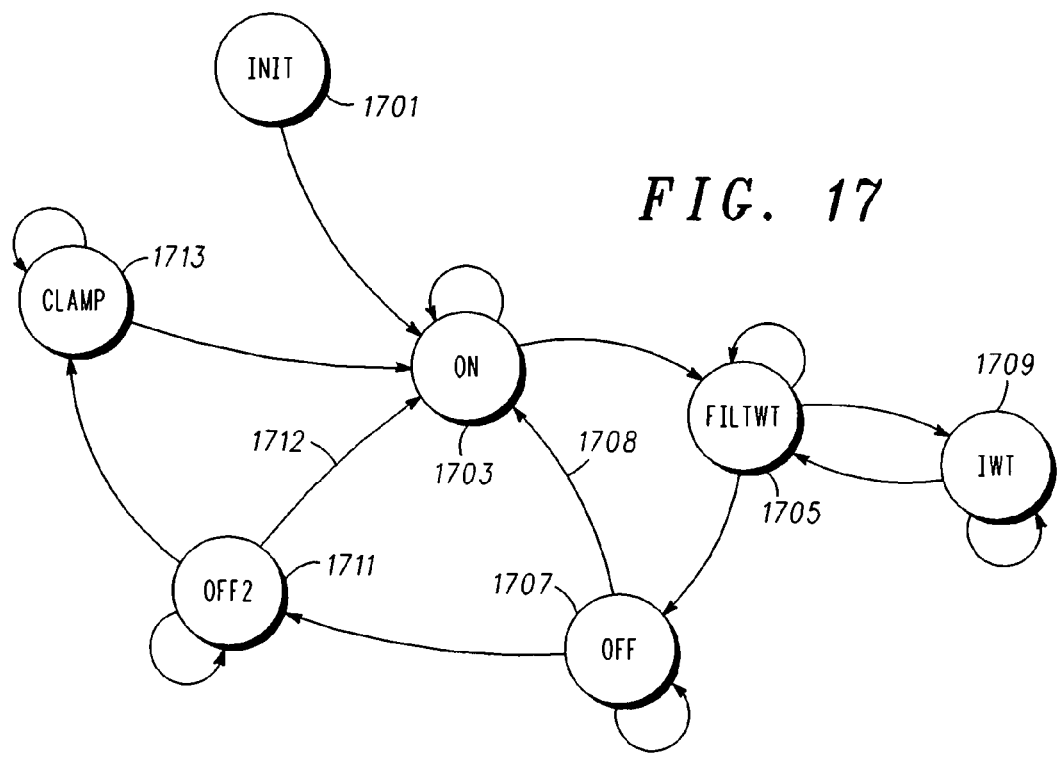
FIG. 17 shows an exemplary state machine that represents an illustrative embodiment of a sequencer that may be used, for example, in FIG. 1 through FIG. 4.

Referring to FIG. 17, an exemplary state machine that represents another embodiment of a sequencer that may be employed in FIG. 1 through FIG. 4 will be discussed and described. "Init" 1701 is the start state. From that state, the output switch or switching stage is immediately turned "On" 1703. The machine starts in the "On" state so the choke feed inductor that is supplying the output transistor can charge up. The machine stays in the "On" state in some embodiments for at least some minimum time "on Min" in order to avoid small glitches and thus avoid possible issues with the life expectancy of the switching stage and various drivers. In this embodiment the machine stays in the "On" state until a threshold level of current, e.g. "iTrigger", is flowing through the switch. This makes sure that the pulse in the output signal is going to go positive rather than negative when the switch opens. Note that the catch diode in the various embodiments also enforces this. The state machine also remains in the "On" state until the loop filter output is negative. This is a way of making the next transition be positive-edge-triggered.

Given that a sufficient number of these preconditions are satisfied, the state machine waits for the loop filter to say go—"filtwt" 1705 (filter wait). If the loop filter says "go" (i.e. makes a transition to a positive value) while we're still seeing positive switch current (meaning that the pulse will go positive if the switching stage is opened), then open the switching stage, i.e., go to state "Off" 1707. Note with the once the switching stage is turned off actual output power starts to be generated, i.e. applied to the resonant circuit and thus load. Otherwise if the switch current goes negative before the filter says "go", go to state "lwt" 1709 ("current wait"). "lwt" just waits for the switch current and loop-filter current phase to be proper and then goes back to waiting on the filter 1705. This means that filter output is negative and thus a positive transition is expected and further means the switch current is positive so when opened a positive pulse is generated.

Given that the state machine is in the "Off" state 1707; if a maximum time "offmax" is exceeded in this state, go back 1708 to state "On" 1703. This was originally proposed as a failsafe operating mode. This has been implemented as the one-shot that resets the D flip flop after a certain period of time. Note that when this transition happens, we may be wasting power when the switch is not being turned on at a safe time (i.e. when drain voltage is zero). Alternatively if the derivative of drain or output voltage goes negative, then the voltage of the output signal is on the way back down and the machine goes to state "Off2" 1711.

In state "Off2", the drain or output signal voltage is on the way down; and either it will cross zero or it will turn around, i.e., start increasing (see FIG. 12). If the output signal voltage turns around and starts going positive, then turn 1712 the switching stage "On" 1703. Note that from an efficiency perspective this may not be a good thing to do, but similar to transition 1708 it is better than letting the output signal voltage continue to increase. Alternatively if the output signal voltage crosses zero, go to state "clamp" 1713, which effectively turns the switching stage on. This can be implemented as a catch diode as noted in one or more embodiments. Stay in the "clamp" state 1713 until the switching stage current goes positive, at which point the state machine goes to state "On" 1703 (transistor switching stage closed) to hold the voltage down. Note that in the above discussed embodiments or circuit implementations it's fine to have the transistor "On" even while the diode is "clamping".

Figure 18:
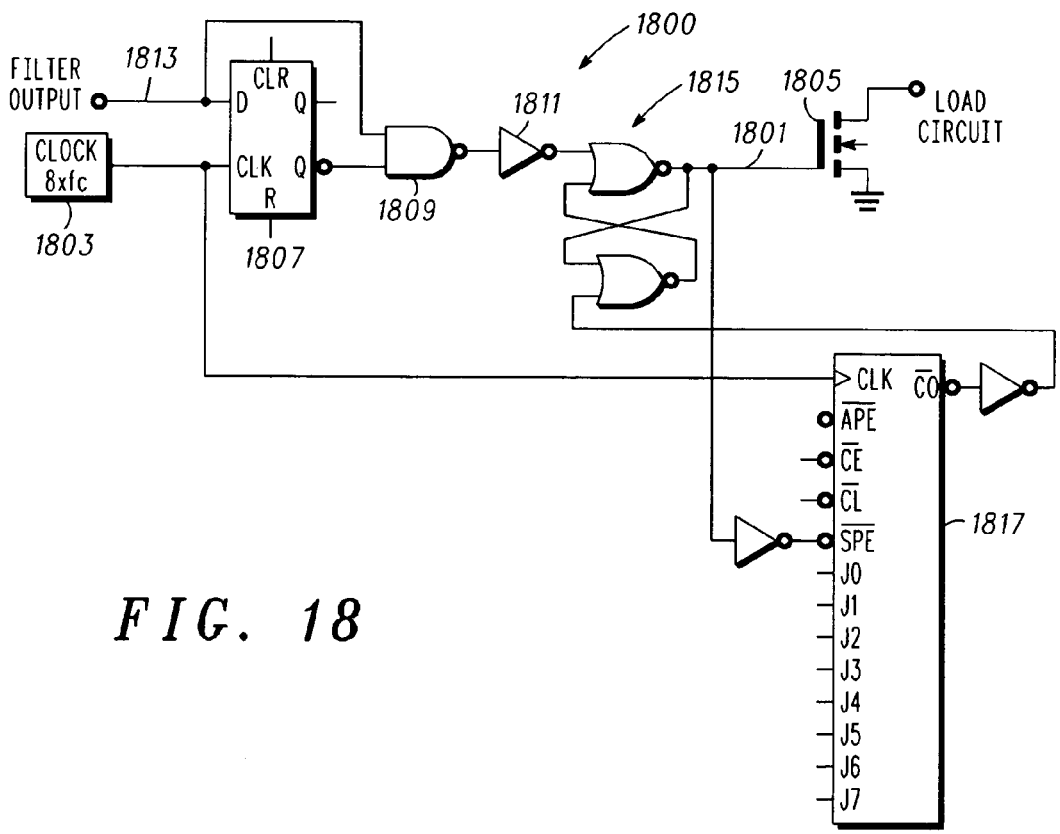
FIG. 18 shows a further illustrative embodiment of a sequencer that may be used, for example, in FIG. 1 through FIG. 4.

Referring to FIG. 18, an alternative embodiment of a sequencer 1800 that provides a sequencer output at 1801 asynchronously when synchronously clocked, e.g., from a fixed clock 1803. The clock 1803 is shown as toggling for example, at 8 times the carrier frequency for an output signal from the corresponding radio frequency power amplifier. The sequencer 1800 may be arranged to generate a plurality of output signals or sequencer outputs with each one having a different and corresponding time profile (e.g., starting and ending time for an OFF state). The sequencer output is used to drive a switching stage 1805, such as the switching stage in one of FIG. 1 through FIG. 4 or the like.

The fixed clock running at 8 times the carrier frequency is a compromise. Higher rates would be better for power amplifier performance, and the sequencer would work at a somewhat lower rate, however 8× is a reasonable compromise between the difficulties of high speeds and the poor performance of coarser sampling. The D flip flop 1807, NAND gate 1809 & inverter 1811 are a zero-crossing detector. The input 1813 from "filter output" is assumed to be appropriately level shifted so that an analogue zero corresponds to the trigger point of logic inputs. The NAND gate is looking for situations where the input used to be 0 (so Q bar is "1") but is now "1". The inverter 1811 converts that into a "1", i.e., positive logic.

The cross-coupled NOR gates 1815 functionally operate as an RS flip-flop. A "1" out of the zero crossing detector (inverter 1811) forces its upper output, i.e. sequencer output at 1801 to "0", i.e. the OFF state, which results in a) turning OFF the RF switching stage 1805 and thus causing a pulse to start and b) starts the one-shot counting. The one-shot 1817 is a binary down counter that can be preloaded, e.g. with 011 (J0, J1). When the RF switch is "ON", this counter is preloaded to "011", i.e. 3 counts plus one delay at a rate of 8× carrier, hence one half-cycle of the carrier. During this "switch ON"—state the carry-out (negative logic, hence inverted) is zero, keeping the RS flip flop 1815 ready to be triggered by the zero-crossing detector. When the RS flip flop 1815 is triggered and the RF switch turns OFF, the counter starts to count down towards zero. When it reaches zero, the carry-out resets the RS flip flop 1815 and the switch and system return to the "switch-ON" state awaiting another trigger.

Note that advantageously the feedback control system 113 of FIG. 1 may be implemented in the discrete time domain using digital signal processing techniques and appropriate continuous to digital and digital to continuous conversion processes at the relevant interfaces.

Other embodiments of the sequencer (not depicted) can select from a plurality of sequencer outputs using interpolation. For example by noting the filter output and possible earlier or intermediate results from the filter (e.g., prior to last integrator) at a clock time or at sequential clock times (the clock having a frequency similar to the carrier frequency), an estimate of the filter output in the recent past and near future can be made and thus one of the plurality of pulses can be selected, e.g. from a look up table, to provide the OFF state or ON state with an appropriate time profile, i.e. a starting time and ending time. The plurality of pulses would be selected such that each varied from the other by a few degrees and thus the appropriate resolution over a carrier period required to control the switching stage would be provided.

Figure 19:
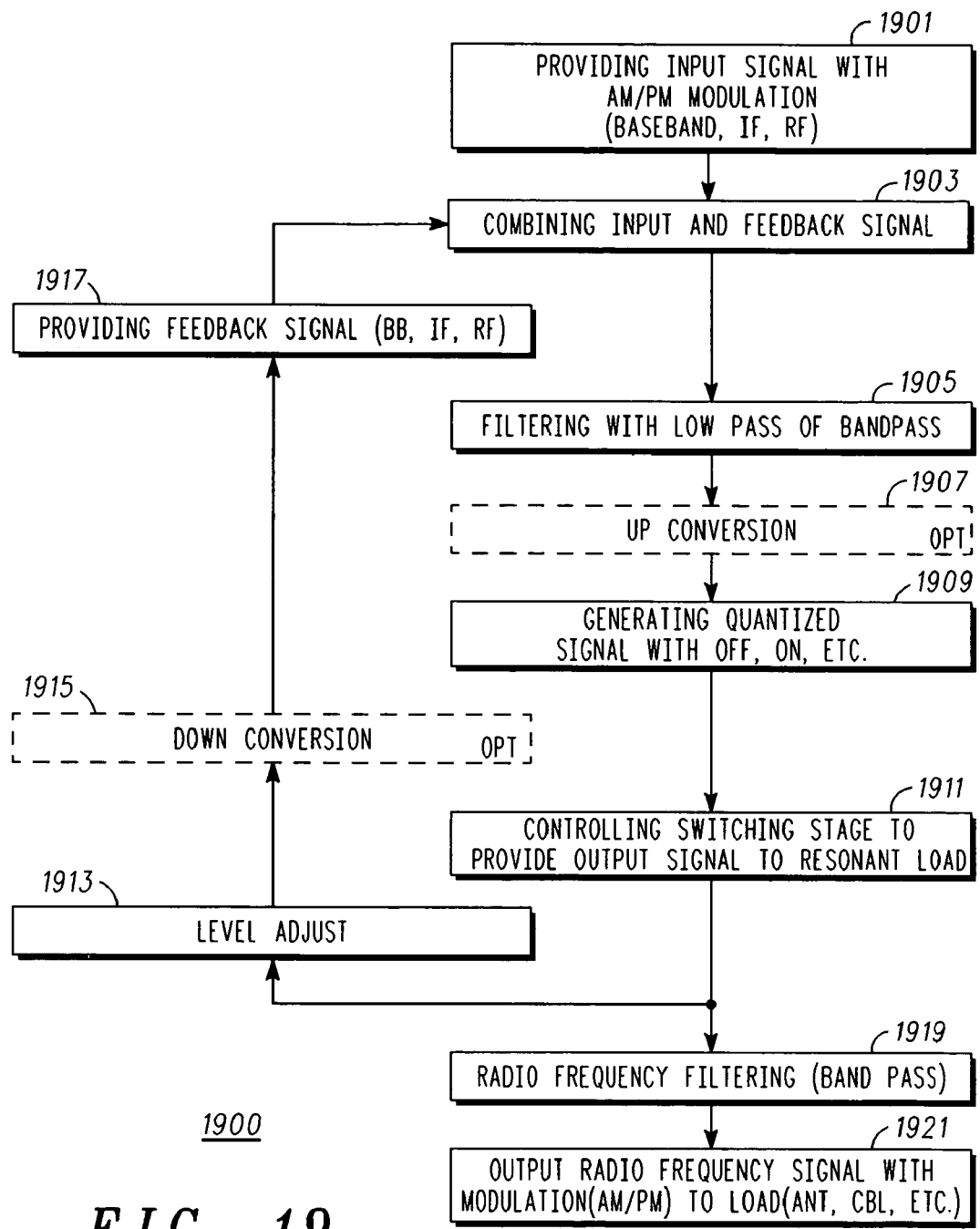
FIG. 19 depicts a flow chart of a method of providing a radio frequency signal with complex modulation according to one or more embodiments.

Referring to FIG. 19, a flow chart of a method of providing a radio frequency signal with complex modulation according to one or more embodiments will be discussed and described. It is noted that the method of FIG. 19 may be implemented in one or more of the embodiments discussed above or in alternative radio frequency amplifiers with similar functionality. Given that many of the inventive concepts and principles embodied in the method of FIG. 19 have been discussed and described above with reference to various apparatus, the present discussion will be in the nature of an overview and summary.

The method 1900 is a method of providing a radio frequency signal with complex modulation (AM, PM, or AM&PM), e.g. an amplified version of an input signal with the same modulation, and begins at start 1901 with providing an input signal including complex modulation (AM/PM modulation) at base band (BB), an intermediate frequency (IF) or radio frequency (RF). At 1903 as shown combining the input signal with a feedback signal at the same frequency is performed. Next the method includes filtering the combination of the input signal and the feedback signal 1905 to provide a filtered signal, where the filtering is done with a low pass filter if the combination signal is a base band signal and ordinarily with a bandpass filter if the signal is centered at an IF or RF (carrier) frequency. As noted earlier if the input signal is at base band, it and the feedback signal will be in complex form and the combining process and filtering processes will handle complex signals.

Next the optional process 1907 can be used to up convert or frequency translate the filtered signal when that signal is at base band. Then 1909 shows generating, responsive to the filtered signal, a quantized signal having an OFF state, ON state, etc. where the OFF state begins at a variable time that corresponds to the filtered signal. Controlling a radio frequency switching stage with the quantized signal to provide an output signal to a resonant load occurs at 1911. The output signal is level adjusted 1913 and optionally down converted in a base band system 1915 and used to provide the feedback signal at BB, IF, or RF 1917 to the combining process at 1903. Note that the output signal comprises an amplified version of the input signal with the complex modulation, i.e., the radio frequency signal with the complex modulation. The feedback signal corresponds to the output signal as level adjusted and in some instances frequency converted which as noted above may include a phase shift. The output signal is filtered 1919 with typically a band pass filter and then output 1921 to a load (antenna, cable, etc.) as a radio frequency signal with modulation.

Note that generating the quantized signal can include generating a quantized signal having a second state, where the second state starts at a time near a voltage minimum for the output signal. The quantized signal can further comprise an OFF state having a minimum time duration and an ON state having a variable time duration.

The processes, apparatus, and systems, discussed above, and the inventive principles thereof are intended to and can alleviate problems caused by prior art radio frequency power amplifiers. Using these principles of defining/providing a radio frequency switching stage with a resonant load and managing or controlling switching times using a feedback control loop or system may simplify faithfully reproducing complex modulation with such switching stages and also allow for reasonable amplifier efficiencies. This is expected to reduce "costs" (economic, size, weight, life expectancy, power consumption, etc.) associated with radio frequency power amplifiers in present and future communication systems and thus facilitate connectivity for users of such systems.

One of the principles used is to control switching times given the switching stage, accompanying resonant load, and specifics of a radio frequency signal with complex modulation, such that on average the switching occurs at or near a voltage minimum across the switching stage. This dramatically reduces power dissipation in and thus increases efficiency of the resultant radio frequency power amplifier. Various embodiments of methods, systems, and apparatus for effecting control of switching stages so as to facilitate and provide for faithful complex modulation of resultant radio frequency power amplifier output signals in an efficient manner have been discussed and described. It is expected that these embodiments or others in accordance with the present invention will have application to many communication networks. Using the inventive principles and concepts disclosed herein advantageously facilitates communications using linear complex modulation which will be beneficial to users and providers a like.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A radio frequency power amplifier comprising:
   a loop filter with an input coupled to a signal corresponding to an input signal and a feedback signal;
   a sequencer responsive to a filter output from the loop filter and configured to provide a sequencer output, where the sequencer output has an OFF state with a starting time that corresponds to the filter output; and
   a radio frequency switching stage driven by the sequencer output and configured to provide an output signal, the feedback signal corresponding to the output signal.

2. The radio frequency power amplifier of claim 1 wherein the signal coupled to the input of the loop filter is an error signal corresponding to a combination of the input signal and the feedback signal.

3. The radio frequency power amplifier of claim 1 wherein the loop filter further comprises a band pass filter.

4. The radio frequency power amplifier of claim 1 wherein the radio frequency switching stage further comprises a radio frequency switching stage arranged in a class E configuration.

5. The radio frequency power amplifier of claim 1 wherein the radio frequency switching stage further comprises a radio frequency switching stage arranged in a class F configuration.

6. The radio frequency power amplifier of claim 1 wherein the radio frequency switching stage as driven by the sequencer output is further configured to provide an output signal including at least one of amplitude modulation and phase modulation imposed on the input signal while powered from a constant voltage power supply.

7. The radio frequency power amplifier of claim 1 wherein the sequencer is further configured to provide the sequencer output with a second state that has a starting time corresponding to a voltage minimum for the output signal.

8. The radio frequency power amplifier of claim 1 wherein the sequencer is further configured to provide the sequencer output where the OFF state has a minimum time duration and the sequencer output further has an ON state having a variable time duration.

9. The radio frequency power amplifier of claim 8 wherein the sequencer is further configured to provide the sequencer output with an OFF state having a predetermined time duration.

10. The radio frequency power amplifier of claim 8 wherein the sequencer is further configured to provide the sequencer output in the OFF state when the filter output corresponds to a predetermined state and to provide the sequencer output in the ON state after a time lapse that corresponds to the minimum time duration starting at the last occurrence of the predetermined state.

11. The radio frequency power amplifier of claim 1 wherein the sequencer is configured to provide the sequencer output asynchronously.

12. The radio frequency power amplifier of claim 1 wherein the sequencer is configured to provide the sequencer output asynchronously when driven by a fixed clock, the sequencer output generated with one of a plurality of time profiles.

13. The radio frequency power amplifier of claim 1 wherein the sequencer further comprises a flip flop clocked from the filter output and the sequencer is configured to provide the sequencer output in the OFF state when triggered by the filter output and in an ON state after a time lapse determined by a Reset signal for the flip flop.

14. The radio frequency power amplifier of claim 1 further comprising a mixer arrangement configured to:
   provide the feedback signal, the feedback signal further corresponding to the output signal as frequency translated by the mixer arrangement; and
   provide a sequencer input corresponding to the filter output as frequency translated by the mixer arrangement.

15. The radio frequency power amplifier of claim 14 wherein the loop filter is a low pass filter.

16. The radio frequency power amplifier of claim 14 wherein the loop filter is a band pass filter.

17. A radio frequency power amplifier arranged and configured to drive a resonant load comprising:
   a radio frequency switching stage with an output that is coupled to a resonant circuit and configured to provide an output signal with amplitude modulation corresponding to amplitude modulation of an input signal when powered from a fixed voltage power supply; and
   a feedback control system coupled to the input signal and the output signal, the feedback control system comprising a sequencer configured to provide a sequencer output that is used to drive the radio frequency switching stage, the sequencer output having an OFF state that begins at a variable time corresponding to the output signal.

18. The radio frequency power amplifier of claim 17 wherein the feedback control system further comprises a loop filter including a band pass filter that is responsive to the input signal and the output signal and configured to provide a filtered signal, wherein the sequencer is responsive to the filtered signal.

19. The radio frequency power amplifier of claim 17 wherein the radio frequency switching stage further comprises at least one of a radio frequency switching stage arranged in a class E configuration and a radio frequency switching stage arranged in a class F configuration.

20. The radio frequency power amplifier of claim 17 wherein the sequencer is further configured to provide the sequencer output with a second state that has a starting time corresponding to a voltage minimum for the output signal.

21. The radio frequency power amplifier of claim 17 wherein the sequencer is further configured to provide the sequencer output where the OFF state has a minimum time duration and the sequencer output further has an ON state having a variable time duration.

22. The radio frequency power amplifier of claim 21 wherein the sequencer is further configured to provide the sequencer output with an OFF state having a variable time duration where the variable time duration is equal to or greater than the minimum time duration.

23. The radio frequency power amplifier of claim 17 wherein the sequencer is configured to provide the sequencer output asynchronously.

24. The radio frequency power amplifier of claim 17 wherein the sequencer is configured to provide the sequencer output asynchronously when driven by a fixed clock, the sequencer output generated with one of a plurality of time profiles.

25. The radio frequency power amplifier of claim 1 wherein the sequencer further comprises a flip flop clocked from the filter output and the sequencer is configured to provide the sequencer output in the OFF state when triggered by the filter output and in an ON state after a time lapse determined by a Reset signal for the flip flop.

26. The radio frequency power amplifier of claim 17 wherein the feedback control system further comprises a mixer arrangement configured to:
   provide a feedback signal, the feedback signal further corresponding to the output signal as down converted by the mixer arrangement; and
   provide a sequencer input corresponding to a combination of the input signal and the feedback signal as up converted by the mixer arrangement.

27. The radio frequency power amplifier of claim 26 wherein the feedback control system further comprises a loop filter that is configured as a low pass filter for filtering the combination of the input signal and the feedback signal.

28. A method of providing a radio frequency signal with complex modulation comprising:
   filtering a combination of an input signal and a feedback signal to provide a filtered signal, the input signal including complex modulation;
   generating, responsive to the filtered signal, a quantized signal having an OFF state that begins at a variable time that corresponds to the filtered signal; and
   controlling a radio frequency switching stage with the quantized signal to provide an output signal to a resonant load, the output signal comprising an amplified version of the input signal with the complex modulation, the feedback signal corresponding to the output signal, the output signal corresponding to the radio frequency signal with the complex modulation.

29. The method according to claim 28 wherein the filtering further comprises bandpass filtering the combination of an input signal and a feedback signal to provide the filtered signal.

30. The method according to claim 28 wherein the generating the quantized signal further comprises generating a quantized signal having a second state, the second state starting at a time near a voltage minimum for the output signal.

31. The method according to claim 28 wherein the generating the quantized signal further comprises generating a quantized signal with an OFF state having a minimum time duration and an ON state having a variable time duration.

32. The method according to claim 28 further comprising providing the feedback signal by down converting the output signal and up converting the filtered signal, wherein the generating the quantized signal is responsive to the filtered signal as up converted.

33. The method according to claim 32 wherein the filtering further comprises low pass filtering the combination of the input signal and the feedback signal.

* * * * *